United States Patent [19]

Lidorenko et al.

[11] 4,174,978
[45] Nov. 20, 1979

[54] SEMICONDUCTOR PHOTOVOLTAIC GENERATOR AND METHOD OF FABRICATING THEREOF

[76] Inventors: Nikolai S. Lidorenko, 3 Mytischinskaya ulitsa, 14a, kv. 127; Vladimir M. Evdokimov, Anadyrsky prospekt, 67, kv. 77; Vitaly V. Zadde, poselok Severny, 9 linia, 3, kv. 120; Alexandr I. Kozlov, ulitsa Mikhailova, 5, kv. 66; Stanislav V. Ryabikov, pereulok Vasnetsova, 12, kv. 64; Valery N. Potapov, ulitsa Timiryazevskaya, 13, kv. 213; Dmitry S. Strebkov, ulitsa Luganskaya, 21; Tatiana I. Surianinova, Dmitrovskoe shosse, 25, kv. 113; Boris A. Chubrikov, ulitsa Fedora Poletaeva, 25, kv. 160, all of Moscow; Valentina V. Zatravina, Mytischinsky raion, derevnya Belyaninova, 6, Moskovskaya oblast; Boris V. Korolev, Shenkursky proezd, 8, kv. 208, Moscow; Viktor F. Kulikov, ulitsa Komarova, 11-b, kv. 56, Moscow; Larisa L. Zhuravleva, ulitsa Bochkova, 8, kv. 64, Moscow; Vadim A. Unishkov, ulitsa Bazhova, 15, korpus 1, kv. 162, Moscow; Anatoly A. Dormidontov, ulitsa Marii Ulianovoi, 11, kv. 93, Moscow; Viktor I. Moiseev, 3 Mytischinskaya ulitsa, 14-a, kv. 74, Moscow; Ljubov P. Kudeshova, Studeny proezd, 38, korpus 2, kv. 391, Moscow, all of U.S.S.R.

[21] Appl. No.: 904,860
[22] Filed: May 11, 1978
[51] Int. Cl.$^2$ ............................................. H01L 31/06
[52] U.S. Cl. ........................... 136/89 PC; 136/89 P; 29/572
[58] Field of Search ............. 136/89 PC, 89 P, 89 SJ, 136/89 CC; 29/572

[56] References Cited

U.S. PATENT DOCUMENTS

| | | | |
|---|---|---|---|
| 3,116,171 | 12/1963 | Nielsen et al. | 136/89 |
| 3,369,939 | 2/1968 | Myer | 136/89 |
| 3,478,214 | 11/1969 | Dillman | 250/211 |
| 4,046,594 | 9/1977 | Tarui et al. | 136/89 SJ |
| 4,082,570 | 4/1978 | House et al. | 136/89 SJ |

*Primary Examiner*—Aaron Weisstuch
*Attorney, Agent, or Firm*—Lackenbach, Lilling & Siegel

[57] ABSTRACT

A semiconductor photovoltaic generator is proposed which comprises a plurality of photovoltaic converters interconnected in series along their opposite surfaces by current-collecting contacts to form a monolithic structure. Every photovoltaic converter is provided with a p-n junction between the base and inverse regions. The photo-active face of the generator is made as a staircase-type structure. The area of every step is inversely proportional to the intensity of incident radiation and the width of the step is about equal to, or smaller than, the diffusion distance of minority carriers in the base region.

8 Claims, 24 Drawing Figures

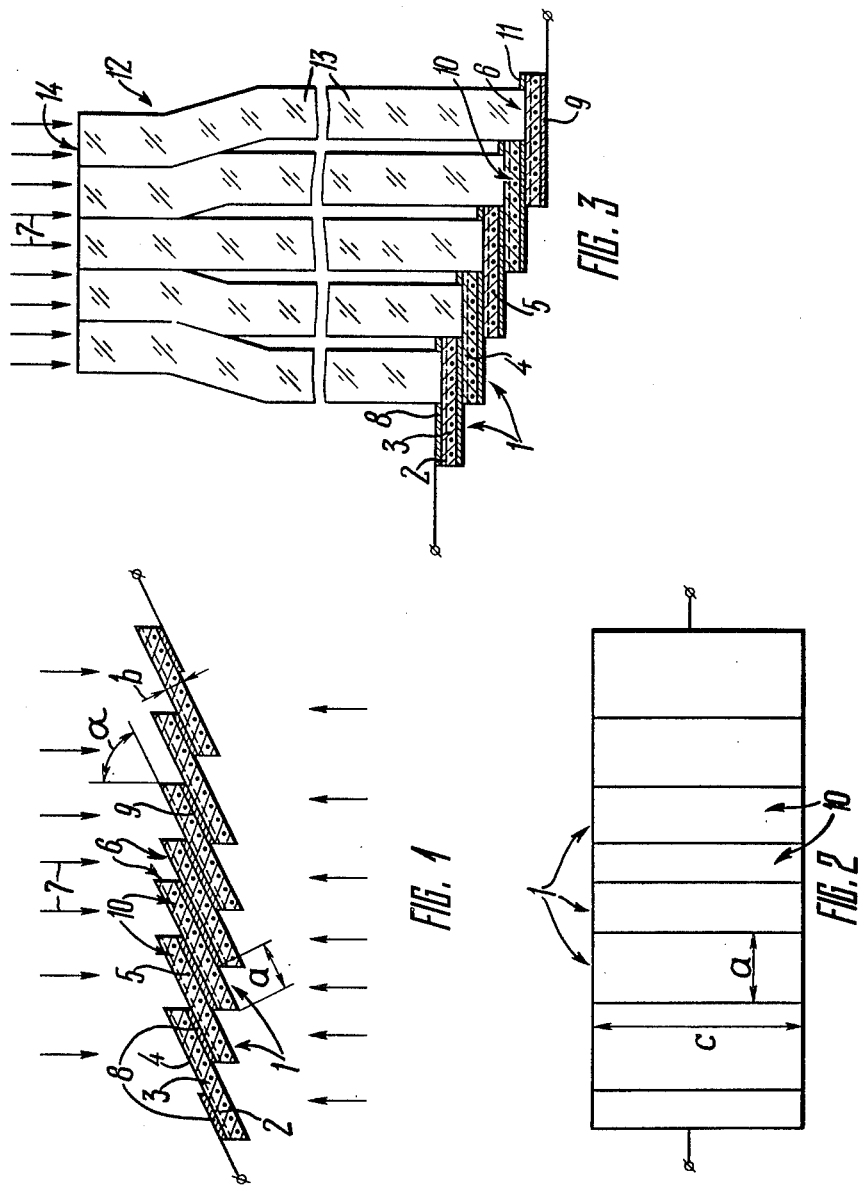

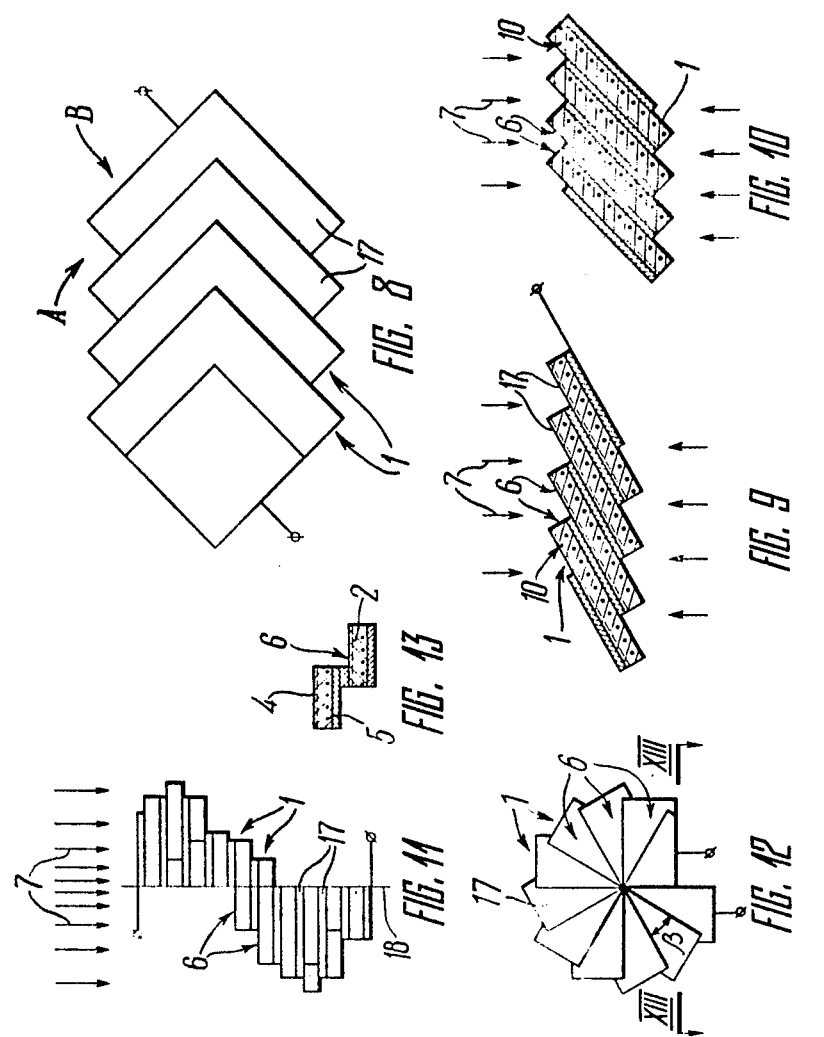

SEMICONDUCTOR PHOTOVOLTAIC GENERATOR AND METHOD OF FABRICATING THEREOF

FIELD OF APPLICATION

The present invention relates to devices for converting solar radiation energy into electricity and, in particular, to semiconductor photovoltaic generators that can be used to advantage in solar power-plant designs.

DESCRIPTION OF THE PRIOR ART

Known in the art is a semiconductor photovoltaic generator comprising a series of photovoltaic converters interconnected electrically. Each converter is made as a wafer of a p-n junction semiconductor material, the junction performing the function of a rectifying barrier which separates the base region having one type of conduction from the inverse region having an opposite type of conduction.

The photovoltaic converters are interconnected by metallic current-collecting contacts connected to the base and inverse regions. The current-collecting contacts that are connected to the inverse region protrude onto the illuminated surface of the semiconductor photovoltaic generator and are arranged in a comb-like manner. Their total area occupies about ten percent of the inverse region surface of the photovoltaic converters. The current-collecting contacts connected to the base region are made as a thin layer occupying the entire rear area of the photovoltaic converters.

Generators of this design have only one photo-active face. Due to a comparatively high value of the spreading resistance in the inverse region, the series resistance power losses reduce the efficiency of the photovoltaic converters illuminated by focused solar radiation. If, however, the gaps between current-collecting contacts are made narrower while their widths are increased, they will shadow the illuminated surface of the semiconductor photovoltaic generator to a much greater extent. Thus, the area of the photo-active face of the generator is reduced, the power produced by a unit area of the generator is reduced and the efficiency of the system is lowered.

Such generators are quite difficult and labor-consuming to produce, since they are fabricated in an element-wise manner, the elements being subsequently assembled into a system.

There are, however, semiconductor photovoltaic generators that are simpler to produce and have higher efficiencies for high degrees of radiation concentration. They are made as monolithic structures having a plurality of photovoltaic converters provided with p-n junctions at their side surfaces bearing metal current-collecting contacts (see, for instance, U.S. Pat. No. 3,422,527). Such photovoltaic converters are made as microminiature parallelepipeds bound together into arrays by current-collecting contacts along opposite side surfaces. The side surfaces are tilted at a certain angle with respect to the photo-active face of the generator, so that the butt-ends of p-n junctions reach the photo-active face.

Such generators are characterized by a higher voltage per unit area of the photo-active face and by a linearly varying current within a range of illumination intensity from 0 to $10^4$ W/cm$^2$. However, since the sensitivity of the photo-active face of a generator of this type to incident radiation is highly non-uniform, it being sufficiently high only in the areas where the p-n junctions reach its surface, such generators suffer from considerable power losses causes by minority carrier surface recombination effects and have relatively low efficiencies. It should also be noted that the lowest efficiency will be obtained when the incident energy is distributed non-uniformly on the surface of the semiconductor photovoltaic generator. This non-uniformity is observed quite often in the distribution of energy within the focal spot of optical concentrators.

BRIEF DESCRIPTION OF THE INVENTION

The object of the present invention is to increase the efficiency of a semiconductor photovoltaic generator in general and especially in instance of non-uniform energy distribution of the incident radiation and of high concentration of the radiation intensity.

Another object of the invention is to reduce current losses and to increase the radiation resistance of a semiconductor photovoltaic generator.

Still another object of the invention is to reduce the amount of labor required to fabricate semiconductor photovoltaic generators.

The essence of the present invention resides in a semiconductor photovoltaic generator comprising a plurality of photovoltaic converters wired in series by current-collecting contacts along opposite planes to obtain a monolithic structure, each converter having a p-n junction between the base and inverse regions. The photo-active face, according to the invention, is made as a staircase-type structure wherein the area of every step is inversely proportional to the power of incident radiation and the width of every step is about equal to, or smaller than, the diffusion distance of minority carriers in the base region.

The problem of increasing the efficiency of the photo-active face and of increasing the photo sensitivity of the generator can be solved by providing an additional current-collecting contact along the perimeter of every step.

The area of the photo-active face and the radiation resistance of the generator can be increased by providing transverse parallel grooves on the surface of the steps, the space between the crests of adjacent grooves being smaller than the diffusion distance of minority carriers in the base region, the p-n junction following the contour of the steps.

It is preferable, in order to increase the sensitivity of the photo-active face and the radiation resistance of the generator, that the thickness of the base region in the photovoltaic converters of the photo-active face be made much smaller that the diffusion distance of minority carriers in the base region.

It is also preferable that the photovoltaic converters be shifted in the commutation planes with respect to one another to obtain said staircase-type structure.

An arrangement which is often convenient comprises photovoltaic converters rotated through a certain angle with respect to one another about an axis crossing the commutation plane so as to obtain said staircase-type structure while using an incident radiation flux with concentric distribution of power within the beam.

When the photovoltaic converters are made as tilted parallelepipeds, it is preferable that the edges of the steps have the form of an acute angle and their surfaces be provided with a mirror coating.

An arrangement which is often convenient comprises photovoltaic converters made as similar figures of diminishing sizes placed one behind another to obtain said staircase-type structure.

Preferably said similar figures are represented by either regular polygons, or discs or rings.

In the method of fabricating semiconductor photovoltaic generators metal-coated semiconductor wafers having p-n junctions are assembled in a stack, interconnected by means of soldering, compressed simultaneously to squeeze out excessive solder and cut into separate arrays at a certain angle to the plane of the plates. According to the invention, the arrays are heated until the solder starts melting, at which moment array elements are shifted along the solder layer with respect to one another to obtain said staircase-type structure. Excess metal on the surface of the steps obtained in this manner is then removed by an etching procedure.

BRIEF DESCRIPTION OF DRAWINGS

The invention will be better understood from the following description of its embodiments given by way of example with reference to accompanying drawings in which:

FIG. 1 is a cross-sectional view of a semiconductor photovoltaic generator with a photo-active face made as a staircase-type structure, according to the invention;

FIG. 2 is a top view of the semiconductor photovoltaic generator shown in FIG. 1, according to the invention;

FIG. 3 is a cross sectional view of a generator of the same design with an additional current-collecting contact, according to the invention;

FIG. 8 is a top view of a semiconductor photovoltaic generator having four photo-active faces, according to the invention;

FIG. 9 is a cross-sectional view of the generator shown in FIG. 8 viewed along arrow A, according to the invention;

FIG. 10 is a cross-sectional view of the generator shown in FIG. 8 viewed along arrow B, according to the invention;

FIG. 11 is a side view of a semiconductor photovoltaic generator made as an assembly of plates rotated about one axis with respect to one another, according to the invention;

FIG. 12 is a top view of the generator shown in FIG. 11, according to the invention;

FIG. 13 is a cross-sectional view of the generator shown in FIG. 12 taken along the line XIII—XIII, according to the invention;

DETAILED DESCRIPTION OF THE INVENTION

Figure 4:
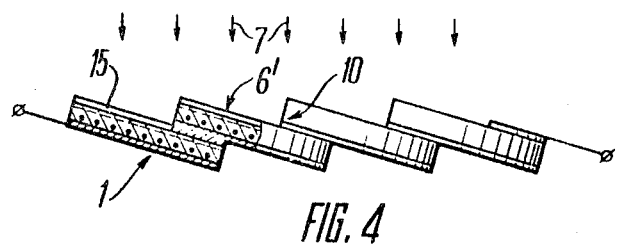
FIG. 4 is a partial cross-sectional view of a a semiconductor photovoltaic generator, wherein grooves are made on the surfaces of the steps, according to the invention.

A semiconductor photovoltaic generator comprises photovoltaic converters 1 made as tilted parallelepipeds (FIGS. 1, 2) which are interconnected in series and assembled to form a monolithic structure. Every photovoltaic converter 1 in the generator is provided with a p-n junction 2 placed in a base region 3 and an inverse region 4. Located in the base region 3 is either an isotype p-p+ or n-n+ junction 5. The p-n junction 2 and the isotype junction 5 are located in the immediate vicinity of a photo-active face 6 which receives a flux 7 of incident radiation. The photo-active face 6 is arranged in a staircase-type structure. Every photovoltaic converter 1 is provided with a current-collecting contact 8 attached to the inverse region 4 and with a current-collecting contact 9 attached to the base region 3.

The width "a" of the base of the steps 10, whose edges form an angle α, is about equal to, or smaller than, the diffusion distance of minority carriers in the base region 3. The area of every step 10 is inversely proportional to the power of the incident radiation flux 7 received by every photovoltaic converter 1. Thus, the area of the steps 10 in the center section of the generator receiving a greater amount of the incident radiation 7 as shown in FIG. 1 is smaller (at the cost of the width "a") than that at the periphery of the generator. The thickness "b" of the photovoltaic converter 1 is smaller than the diffusion distance of minority carriers in the base region 3. All the photovoltaic converters 1 have the same length "c" (FIG. 2) which is of no particular importance. The photovoltaic converters 1 are wired to one another along their opposite surfaces and are shifted with respect to one another in the commutating planes.

The generator operates as follows. A flux 7 of incident radiation strikes the staircase-type photo-active surface 6 of the generator having p-n junction 2 or isotype junction 5 located in the immediate vicinity of said surface. Thus, current losses caused by surface recombination of light generated carriers are reduced to a minimum.

Additional absorption of the radiation 7 reflected by one of the facets of the steps 10 may occur at adjacent facets of nearby steps 10. Thus, reflection losses of the radiation 7 are also reduced and the area of the photo-active face 6 of the generator is increased.

Variations of the intensity of the incident radiation flux 7 are counter-balanced by respective variations of the area of the photo-active face 6 by altering the width "a" of the base of the steps 10 within a specified range (i.e. by altering their areas). Thus, the value of the current generated by every photovoltaic converter 1 will be the same throughout the operating surface of the generator.

Power losses due to series resistances will be reduced to a minimum if the width "a" of the base of the steps 10 is made about equal to the diffusion distance of the minority carriers in the base region 3, since almost all the minority carriers generated by the incident radiation 7 in this case will be collected by the p-n junction 2 located below the continuous current-collecting contact 8 and driven towards the inverse region 4. The current-collecting contacts 8 and 9 are made of a highly conductive metal which has a negligibly small resistance value. The value of the series resistance of the generator can be as small as several thousandths of an Ohm.cm$^2$. Thus, the generator is able to provide high efficiencies while being illuminated by focused solar radiation, for instance, when located in the focal plane of a linear paraboloid.

The generator will provide high efficiencies while illuminated both from the side of the p-n junction 2 or from the side of the isotype junction 5.

If the generator is made of silicon, typical dimensions of its elements will be as follows: photovoltaic converter thickness "b"—from 0.2 mm to 0.5 mm; step base width "a" from 0.2 mm to 1.0 mm; and photovoltaic converter length "c"—from 5 mm to 50 mm. The depth at which the p-n junction 2 and the isotype junction 5 are buried in the photo-active face 6 is from 0.1 $\mu$m to 0.5 $\mu$m. The number of photovoltaic converters per 1 cm$^2$ of the generator's surface is from 10 to 30 pieces, the value of the voltage gradient being from 5 V/cm to 15 V/cm. The thickness of the current-collecting contacts is from 5 $\mu$m to 10 $\mu$m.

A generator designed as shown in FIG. 1 will have a larger photo-active face 6 of the photovoltaic converters 1 than when connected in series in overlying relationship. Besides, it makes it possible to match the area of the photo-active face 6 with the intensity distribution of the incident radiation flux, to reduce power losses due to non-uniform incident radiation fluxes and to increase the efficiency of the generator when it receives highly concentrated radiation.

A version of the semiconductor photovoltaic generator presented in FIG. 3 comprises photovoltaic converters 1 each of which, in addition to a basic current-collecting contact 8 attached to the inverse region 4, is provided with another current-collecting contact 11 connected electrically to the basic contact 8 and arranged along the perimeter of every step 10. The part of the surface of the steps 10 which is free from the current-collecting contact 11 forms a photo-active face 6 of the photovoltaic converters 1. The face 6 receives the radiation flux 7 via a lightguide 12. The lightguide 12 is made as a set of light-conducting elements 13 formed by glass ribbons. The cores of these ribbons have an index of refraction which is higher than that of the surfaces of the ribbons. The ribbons are pressed against each other near the radiation receiving surface 14 and are arranged in a fan-like fashion pointing in the direction of the photo-active face 6 of the generator.

The butt-ends of the light-conducting elements 13 are in contact with the photo-active faces 6 of the photovoltaic converters 1 and match them in size.

The current-collecting contacts 9 attached to the base regions 3 are formed as a continuous layer arranged along the isotype junction 5.

The operation of this embodiment of the generator is similar to that of the embodiment shown in FIGS. 1 and 2. However, this version makes it possible to improve the effectiveness of the photo-active face 6 and to increase the efficiency of the generator, which is due to the fact that the p-n junction 2 collects almost all the current carriers generated by the incident radiation, while the spreading resistance in the base and inverse regions 3 and 4 is reduced to the minimum. This result is attributed to the fact that the radiation flux 7 is applied to the photo-active face 6 via the lightguide 12 and that the gap between the current-collecting contacts 8 and 11 and the photo-active face 6 is quite small.

Generally, the light conducting elements 13 may have various values of thickness so that, in case of the non-uniform incident radiation flux 7, the amounts of power transferred onto the photo-active faces 6 will be equal.

Figure 5:
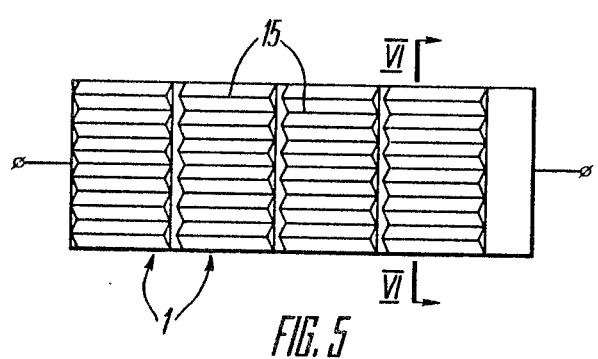
FIG. 5 is a top view of the generator shown in FIG. 4, according to the invention.
Figure 6:
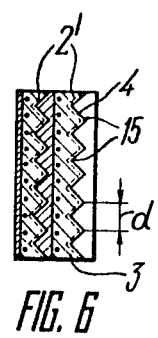
FIG. 6 is a cross-sectional view of the generator shown in FIG. 5, according to the invention, taken along the line VI—VI.

Shown in FIGS. 4, 5 and 6 is another embodiment of the generator wherein, in contrast to the above embodiment, the photo-active faces 6' of the steps 10 in every photo-voltaic converter 1 are provided with transverse parallel grooves 15 having their crests spaced a distance "d" from one another. The distance "d" is selected to be smaller than the diffusion distance of minority carriers in the base region 3. The p-n junction 2' follows the contour of the surface of the steps 10.

This generator, when compared with the embodiments shown in FIGS. 1 through 3, exhibits a greater area of the photo-active face 6' and makes it possible to absorb the incident rediation flux in a thin subsurface layer located in the immediate vicinity of the p-n junction 2', due to which the minority carrier collection rate is increased and the radiation resistance of the generator is increased. It is expedient that the space "d" between the crests of adjacent grooves be made much smaller than the diffusion distance of minority carriers in the base region 3.

The grooves 15 are made across the steps 10. Because of this arrangement the value of the spreading resistance in the inverse region 4 is reduced to the required minimum irrespective of the size of the grooves 15, while the efficiency of the generator is increased for high levels of incident flux concentration.

Figure 7:
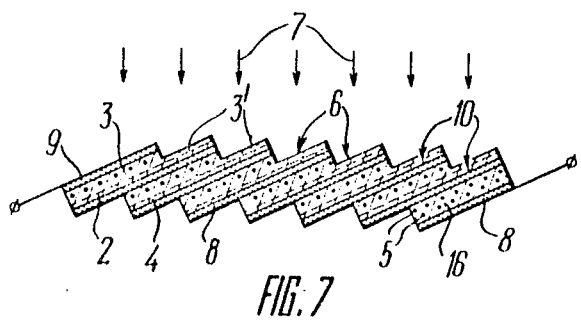
FIG. 7 is a cross-sectional view of a semiconductor photovoltaic generator wherein the base region is of a variable thickness, according to the invention.

Shown in FIG. 7 is still another embodiment of the generator wherein the base region 3' on the surface of the steps 10 in the photovoltaic converters 1 is thinner than the rest of the photovoltaic converters 1. It is expedient that the thickness of the base region 3' be made much smaller than the diffusion distance of minority carriers in the base region 3.

The p-n junction 2 is located on the side opposite that of the photo-active face 6. The surface of the inverse region 4 bears a current-collecting contact 8 made as a continuous layer. In this embodiment, the photo-active face 6 is treated chemically to reduce the minority carrier surface recombination rate to zero.

Due to the fact that the diffusion distance of minority carriers is initially great and that it is much greater than the thickness of the base region 3' on the steps 10, this embodiment exhibits a high minority carrier collection ratio and an increased value of radiation resistance irrespective of the nature of damaging radiation.

In order to increase the mechanical strength of the outer photovoltaic converter 1, it is connected to the current-collecting contact via an intermediate semiconductor plate 16 having an isotype junction 5 on both sides.

Shown in FIGS. 8, 9 and 10 is a generator comprising photovoltaic converters 1 made as rectangular parallelepipeds shifted with respect to one another along the commutation surfaces 17. The photo-active face 6 of this generator version comprises steps 10 arranged on four facets of the generator body.

This generator produces twice as much electricity as the device shown in FIGS. 1 and 2 when illuminated with incident radiation of a similar intensity from four sides, which is due to the larger area of the photo-active face 6.

Shown in FIGS. 11, 12 and 13 is another embodiment of the generator comprising photovoltaic converters 1 made as parallelepipeds rotated an angle $\beta$ (in a fan-like fashion) about an axis 18 which crosses the commutation plane 17.

In this embodiment the photo-active face 6 is also arranged in a staircase-type structure which forms a concentric figure having its center on the axis 18. Located in the immediate vicinity of the photo-active face 6 is a p-n junction 2. It is expedient that the angle $\beta$ exceed 30°. This design of the generator appears to be the most optimum since the power distribution in the radiation flux 7 is concentric and the maximum radiation density is at the center located on the axis 18. The value of the spreading resistance in the inverse region 4 near the axis 18 is negligibly small. It grows with the distance from the axis 18. However, the concentration of the radiation flux 7 is reduced too, so that the value of the allowable spreading resistance is correspondingly increased.

When compared with the embodiments shown in FIGS. 1 through 10, this generator exhibits higher efficiencies for higher intensities of the radiation flux with concentric intensity distribution, since the photo-active face forms a concentric figure which is co-axial with the radiation flux.

Figure 14:
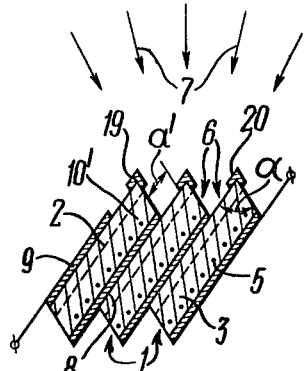
FIG. 14 is a cross-sectional view of a semiconductor photovoltaic generator wherein the edges of the steps in a staircase-type structure are provided with a mirror coating, according to the invention.
Figure 15:
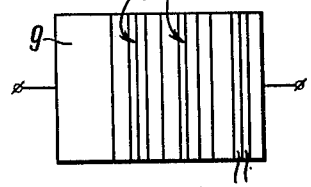
FIG. 15 is a top view of the generator shown in FIG. 14.

Shown in FIGS. 14 and 15 is a generator comprising photovoltaic converters 1 made as tilted parallelepipeds having acute angle steps 10' with edges forming an angle $\alpha$. The photovotaic converters 1 have p-n junctions 2 on one side and isotype junctions 5 on their other side. Edges 19 of the steps 10 are provided with a mirror coating 20 made, for instance, of aluminium.

The width "a'" of the photo-active face 6 of the steps 10' which bears no coating 20 does not exceed the diffusion distance of minority carriers in the base region 3. It is expedient that the angle $\alpha$ does not exceed 30°. The radiation flux 7 striking the mirror coating 20 is reflected onto the photo-active faces of adjacent steps 10'. The reflection ratio depends on the incidence angle of the flux 7 and may be from 40% to 95%. In the course of the reflection the radiation flux 7 is absorbed mainly in the regions adjacent to the current-collecting contacts 8 and 9. Because of this arrangement, power losses caused by the spreading resistance are reduced. At the same time it increases the probability that minority carriers are collected at the p-n junction 2, the distance to which is smaller than the diffusion distance of minority carriers in the base region 3.

When compared with the embodiment shown in FIGS. 1 and 2, this generator design makes it possible to reduce reflection losses when the generator is illuminated with an isotropic radiation flux 7 and to increase the efficiency even in cases of high radiation flux intensity.

Figure 16:
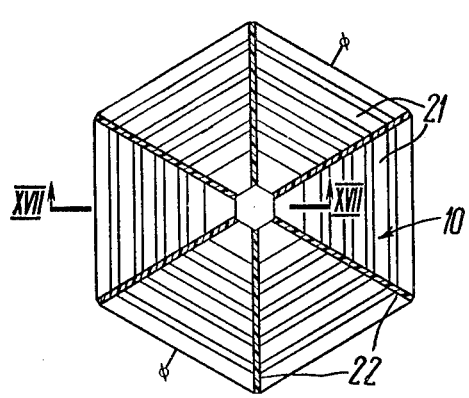
FIG. 16 is a top view of a semiconductor photovoltaic generator using photovoltaic converters made as similar polygons, according to the invention.
Figure 17:
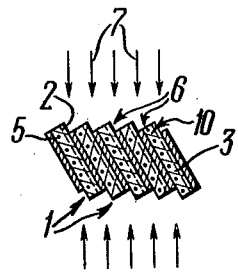
FIG. 17 is a cross-sectional view of the generator shown in FIG. 16, according to the invention, taken along the line XVII—XVII.

An embodiment of the generator shown in FIGS. 16 and 17 comprises photovoltaic converters 1 made as similar polygon figures, equilateral trapezoids in particular, arranged in order of diminishing size, one beyond another, to form a photo-active face 6 having a staircase-type structure.

This generator comprises six sections 21 arranged symmetrically about a common center, each section being made of photovoltaic converters 1 connected is series. The sections 21 are secured to one another by dielectric layers 22.

The area of the photo-active face 6 of the photovoltaic converters 1 increases gradually with the distance from the center of the generator due to the increase of the length of the steps 10.

Because of this arrangement it becomes possible to reduce power losses when the generator is illuminated with a circular radiation flux 7 wherein the energy concentration maximum is close to its center.

When compared with the embodiment shown in FIGS. 11, 12 and 13, this generator makes it possible to obtain a voltage gradient per unit area which will be higher by a factor of ten or more.

Figure 18:
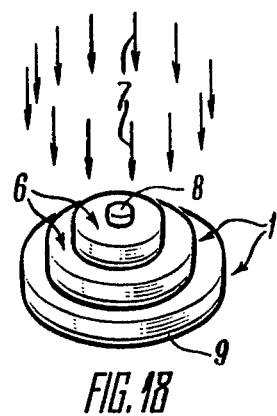
FIG. 18 is an isometric view of a semiconductor photovoltaic generator using photovoltaic converters made as similar discs, according to the invention.
Figure 21:
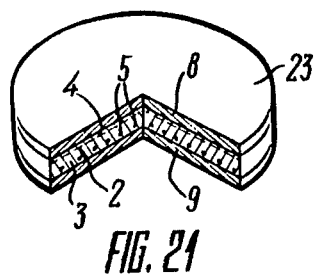
FIG. 21 is a partial isometric and partial-sectional view of a semiconductor photovoltaic generator during fabrication of a diode structure in the course of production, according to the invention.
Figure 19:
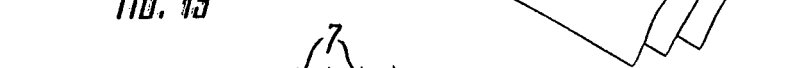
FIG. 19 is a cross-sectional view of the generator shown in FIG. 18, according to the invention.

Shown in FIGS. 18 and 19 is a generator comprising photovoltaic converters 1 made as discs of similar shapes. The photo-active face in this case is formed by ring steps 10. The area of each step 10 is matched with the concentration value of the circular incidence radiation flux 7.

This design of the generator permits a reduction in the spreading resistance and an increase in the illumination range within which the current and the power continue to be linearly dependent on the intensity of the radiation flux 7.

Figure 20:
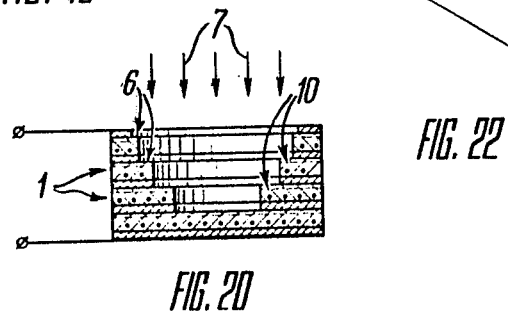
FIG. 20 is a cross-sectional view of a semiconductor photovoltaic generator using photovoltaic converters made as similar rings, according to the invention.
Figure 23:
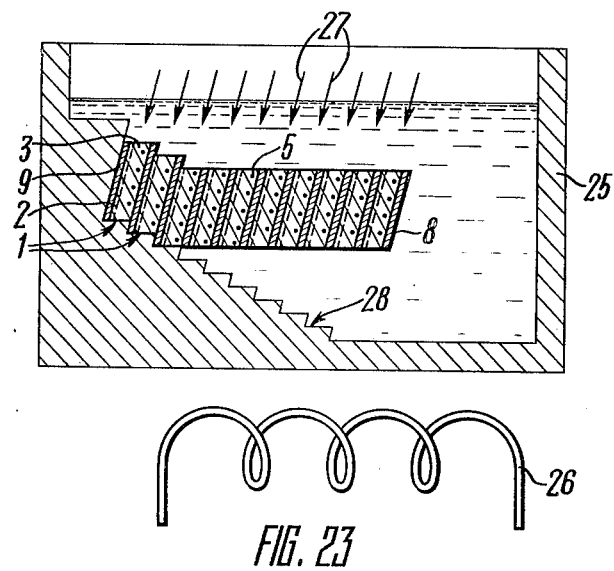
FIG. 23 is an isometric view of the generator shown in FIG. 22 in a bath during the step of the shifting photovoltaic converters in the commutation plane in the course of production, according to the invention.

Shown in FIG. 20 is a generator which comprises photovoltaic converters 1 made as rings of similar shape arranged in order of diminishing size. In this case the photo-active face 6 is represented by a stepped cavity. The base of the generator is formed by a photovoltaic converter 1 made as a disc.

When compared with the embodiment shown in FIGS. 18 and 19, this generator has a higher efficiency when it is illuminated with a circular radiation flux 7, since the photo-active face 6 is not shadowed by the current-collecting contacts 8 and 9 while the geometry of the steps 10 insures that the generated carriers are collected completely and the power losses due to the series resistance of the generator are reduced.

In the majority of the generator designs according to the invention, the current-collecting contacts occupy no more than 1% of the area of the photo-active face. An increase in the number of photovoltaic converters per unit volume of the generator results in a reduction of the step size and of the value of the series resistance, in the growth of the generated carrier collection ratio, in the reduction of the reflection ratio, in the growth of the generator radiation resistance and in the broadening of the radiation intensity range wherein the values of current and power produced by the generator remain linearly dependent on the intensity of radiation.

The generator shown in FIGS. 1 and 2 exhibits two-sided photo-sensitivity with practically the same efficiency on each side and can be used as an element of solar power batteries illuminated on both sides.

The concentric generators shown in FIGS. 11, 12, 13, 16, 17, 18, 19 and 20 exhibit high efficiencies when used in conjunction with optical concentrators made in the form of a body of revolution. They can be employed in attitude reference systems as coordinate sensors.

FIGS. 21, 22, 23 and 24 present a succession of major steps involved in fabricating a semiconductor photovoltaic generator as shown in FIGS. 1 and 2.

The fabrication procedure, according to the invention, consists of the following steps.

Figure 22:
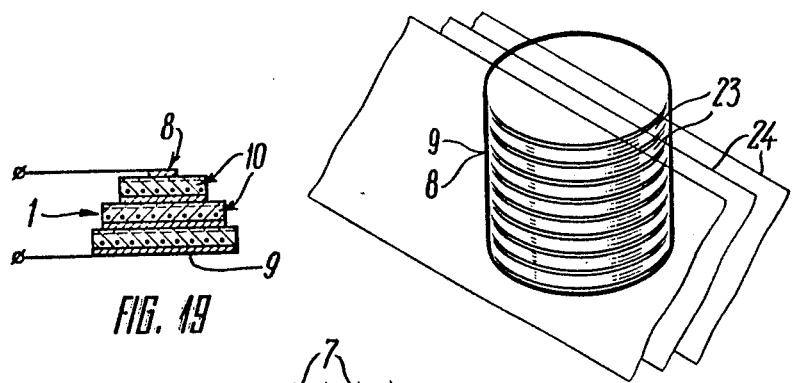
FIG. 22 is an isometric view of the generator shown in FIG. 21 during assembly of diode structures into a stack in the course of production, according to the invention.

Initial metal-coated semiconductor wafers 23 (FIG. 21) having a p-n junction 2 located along one of its sides are assembled in a stack as shown in FIG. 22. In the stack the plates 23 are interconnected in series with one another via the current-collecting contacts 8 and 9 to form a monolithic structure by means of soldering them with the use of a soft solder. Simultaneously, the stack is compressed to squeeze out excessive solder.

Then the stack is cut into separate arrays along planes 24 oriented at an angle with respect to the plane of the wafers 23.

The arrays are then placed into a bath 25 (FIG. 23) filled with a high boiling liquid. Using a heater 26, the temperature of the liquid is raised until it reaches that of the molten solder. At this moment a force is applied to the arrays in the direction as shown by arrows 27 in FIG. 23. Yielding to the force, the array elements shift with respect to one another along solder layers to match the contour of a staircase-type support 28 fixed to the bottom of the bath 25.

Figure 24:
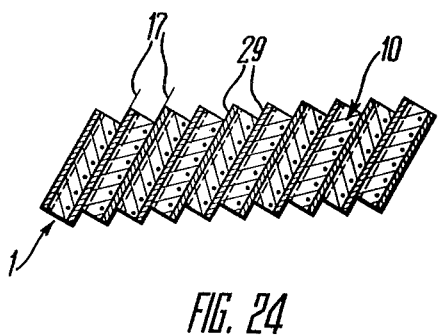
FIG. 24 is an isometric view of the generator shown in FIG. 23 after shifting the photovoltaic converters in the course of production, according to the invention.

After cooling, an array structure is obtained as shown in FIG. 24 which consists of photovoltaic converters 1 shifted in commutation planes 17 with respect to one another and provided with a metal coating 29 on the surface of steps 10.

The last phase of the fabrication procedure consists of etching away the metal layer 29. During this phase the surface of the semiconductor material is completely cleaned while the surface of the steps 10 is covered with an anti-reflection coating.

This method of fabricating a generator having a photo-active face of staircase-type structure allows simultaneously handling of a plurality of photovoltaic converters during one production phase and thus minimizes the amount of required hand labor. Hence, it simplifies the procedure of fabricating generators and increases the productivity.

The method allows the fabrication of generators with a photo-active face of a staircase-type structure located on one, two, three or four facets of the generator while selecting the shape of steps such as to insure maximum efficiency.

Following is a detailed description of the procedure used to fabricate a generator as shown in FIGS. 1 and 2.

Silicon wafers of initial p-type conduction were cleaned and polished chemically and mechanically so as to remove the damaged layer from the surface. Then diode structures were formed on the wafers, to which end acceptor and donor impurities were introduced into opposite sides of the plates by means of simultaneous diffusion to a depth of from 0.1 $\mu$m to 0.5 $\mu$m. After doping, a continuous layer of metal was applied on both sides of the plates by means of vacuum deposition. Then the silicon plates having a metal coat on both sides were soldered to one another throughout their surfaces using a soft solder to make a stack. Simultaneously, the stack was compressed to squeeze out excessive solder. The stack was then cut into arrays at a preselected angle with respect to the p-n junction planes.

The arrays obtained in this way were then placed into a bath where they were heated to the melting temperature of the solder. After that, the array elements (photovoltaic converters) were shifted with respect to one another along the solder layer until a staircase structure was formed wherein the width "a" of the steps was equal to the diffusion distance of minority carriers in the base region, as shown in FIGS. 1 and 2.

Then the staircase-type structures were chemically etched in order to remove the damaged layer from the surface of the semiconductor material as well as to remove metal contacts from the surface of the steps. This process also served to eliminate shunts and to increase the level of photo-activity of illuminated surfaces. Then current collectors were soldered to current-collecting contacts 8 and 9.

The efficiency of this generator appeared to reach 10% at an intensity of incident radiation flux exceeding 100 W/cm$^2$.

In order to fabricate a semiconductor photovoltaic generator as shown in FIG. 3, the same operations as above are performed. However, prior to subjecting the components to chemical etching the metal contacts along the perimeter of the steps 10 are coated with a chemically resistant film to protect them from the etching substance. Thus, additional current-collecting contacts 11 are obtained.

A lightguide 12 is made of thin glass ribbons serving as light conducting elements 13 having their butt-ends on one side glued to a photo-active face 6, while the opposite butt-ends are arranged in a group to form a receiving surface 14. Using a chemical treatment procedure, the subsurface of the glass is made to have a lower index of refraction.

In order to fabricate a generator as shown in FIGS. 4, 5 and 6, the same operations are performed as required to fabricate the generator as shown in FIGS. 1 and 2. However, prior to forming the diode structures, the silicon plates having their surfaces oriented along <100> planes are etched anisotropically on one side in an alkaline solution to form grooves 15 on the surface of the plates, the direction and pitch of the grooves being preset by a chemically resistant photoresist film that is applied beforehand.

Another difference in this procedure is that the silicon wafers are assembled into a stack so that the grooves on all the wafers are parallel while the plane 24 along which the stack is cut into arrays lies orthogonally with respect to the grooves 15.

In order to fabricate a generator as shown in FIG. 7, it is necessary to perform the operations required to fabricate the generator as shown in FIGS. 1 and 2. However, the operation involving the chemical etching of contacts is followed by an operation involving the chemical etching of silicon on the staircase-type structure bearing the isotype junction 5. The etching will be carried out until the base region 3' on the photo-active face 6 of the photovoltaic converters 1 becomes several times thinner, i.e. until it is from 10 μm to 30 μm thick.

In order to fabricate a generator as shown in FIGS. 8, 9 and 10, it is necessary to perform the operations required to fabricate the generator as shown in FIGS. 1 and 2. However, the stack is cut into arrays of square elements which are then shifted along the layer of solder in two mutually orthogonal directions.

In order to fabricate a generator as shown in FIGS. 11, 12 and 13, it is necessary to perform the operations required to fabricate the generator as shown in FIGS. 1 and 2. However, after all the sides of the array are trimmed to remove shunts the photovoltaic converters 1 will be rotated through an angle β in the commutation planes 17 about the axis 18.

In order to fabricate a generator as shown in FIGS. 14 and 15, it is necessary to perform the operations required to fabricate the generator as shown in FIGS. 1 and 2. However, the stack will be cut into arrays at a more acute angle to the plane of p-n junctions 2, the surface of the cut will be polished and, finally, the edges of the steps will be coated with an aluminium layer of about 0.05 μm. The layer will be deposited in a vacuum at an angle in order to serve as a mirror.

In order to fabricate a generator as shown in FIGS. 16 and 17, it is necessary to perform the operations required to fabricate the generator as shown in FIGS. 1 and 2. However, the ready device will be scribed into six trapezoidal shaped sections. The sections then will be interconnected with the help of a dielectric layer 22 to form a hexagon generator.

In order to fabricate a generator as shown in FIGS. 18 and 19, silicon plates having diode structures and a metal coating will be cut into discs of gradually diminishing diameters. The discs will be soldered in series to form a co-axial stack. In the course of soldering, the stack will be compressed to squeeze out excessive solder. The current-collecting contacts on external discs will be protected with a chemically resistant film, after which metal contacts from the surface of steps 10 will be chemically etched off.

In order to fabricate a generator as shown in FIG. 20, silicon plates having diode structures and a metal coating will be cut into rings of various diameters. Simultaneously, one disc of the same material will be made with a diameter exceeding those of the rings. The disc will be used as a base for the rings which will be arranged on it co-axially in order of diminishing size and soldered into a stack. Excessive solder will be removed by means of compressing the stack. Then the current-collecting contacts on external photovoltaic converters will be protected with a chemically resistant varnish, while the metal contacts on the surface of steps 10 and on the central section of the disc-shaped photovoltaic converter will be chemically etched off.

What is claimed is:

1. A semiconductor photovoltaic generator comprising: a plurality of semiconductor photovoltaic converters, a p-n junction in each of said photovoltaic converters located between a base region and an inverse region of each said photovoltaic converter; a plurality of current-collecting contact pairs, the number of which is equal to the number of said photovoltaic converters, said contacts being located individually on opposite sides of said photovoltaic converters and interconnecting said photovoltaic converters in series to form a monolithic structure; a photoactive face of said generator made as a staircase-type structure and having a plurality of steps, each step having a width that is about equal to, but does not exceed, the diffusion distance of minority carriers in the base region, said steps each having an area which is inversely proportional to the power of incident radiation received by it, transverse parallel grooves being made in the surfaces of said steps, the distance between the crests of said adjacent grooves not exceeding the diffusion distance of minority carriers in said base region, said p-n junction following the contour of the surface of said steps.

2. A semiconductor photovoltaic generator as claimed in claim 1 wherein said base region of said photovoltaic converters located near said photo-active face has a thickness which is smaller than the diffusion distance of minority carriers in said base region.

3. A semiconductor photovoltaic generator as claimed in claim 2, wherein said photovoltaic converters are shifted with respect to one another to form said staircase-type structure.

4. A semiconductor photovoltaic generator as claimed in claim 1 wherein said photovoltaic converters are shifted with respect to one another to form said staircase-type structure.

5. A semiconductor photovoltaic generator comprising: a plurality of semiconductor photovoltaic converters, a p-n junction in each of said photovoltaic converters located between a base region and an inverse region of each said photovoltaic converter; a plurality of current-collecting contact pairs, the number of which is equal to the number of said photovoltaic converters, said contacts being located individually on opposite sides of said photovoltaic converters and interconnecting said photovoltaic converters in series to form a monolithic structure; a photoactive face of said generator made as a staircase-type structure and having a plurality of steps, each step having a width that is about equal to, but does not exceed, the diffusion distance of minority carriers in the base region, said steps each having an area which is inversely proportional to the power of incident radiation received by it, said photovoltaic converters being shifted with respect to one another to form said staircase-type structure, said photovoltaic converters being made as tilted parallel parallelepipeds, and said steps having acute-angled edges which are provided with a mirror coating.

6. A semiconductor photovoltaic generator comprising: a plurality of semiconductor photovoltaic converters, a p-n junction in each of said photovoltaic converters located between a base region and an inverse region of each said photovoltaic converter; a plurality of current-collecting contact pairs, the number of which is equal to the number of said photovoltaic converters, said contacts being located individually on opposite sides of said photovoltaic converters and interconnecting said photovoltaic converters in series to form a monolithic structure; a photoactive face of said generator made as a staircase-type structure and having a plurality of steps, each step having a width that is about equal to, but does not exceed, the diffusion distance of minority carriers in the base region, said steps each having an area which is inversely proportional to the power of incident radiation received by it, said photovoltaic converters being made as similar discs arranged one above another in order of diminishing size to form said staircase-type structure.

7. A semiconductor photovoltaic generator comprising: a plurality of semiconductor photovoltaic converters, a p-n junction in each of said photovoltaic converters located between a base region and an inverse region of each said photovoltaic converter; a plurality of current-collecting contact pairs, the number of which is equal to the number of said photovoltaic converters, said contacts being located individually on opposite sides of said photovoltaic converters and interconnecting said photovoltaic converters in series to form a monolithic structure; a photoactive face of said generator made as a staircase-type structure and having a plurality of steps, each step having a width that is about equal to, but does not exceed, the diffusion distance of minority carriers in the base region, said steps each having an area which is inversely proportional to the power of incident radiation received by it, said photovoltaic converters being made as similar rings arranged one above another in order of diminishing size to form said staircase-type structure.

8. A method of fabricating semiconductor photovoltaic generators comprising the following steps: assembling a plurality of metal-coated semiconductor wafers, each having a p-n junction along one of its surfaces, into a stack; interconnecting said wafers in said stack to one another by soldering; simultaneously compressing said stack to squeeze out excessive solder; cutting said soldered stack at an angle with respect to the plane of said wafers to obtain individual arrays; heating said arrays to the melting temperature of said solder; shifting the elements of said arrays with respect to one another along the layer of said solder to obtain a staircase-type structure; and etching excess metal off the surface of the steps of said staircase-type structure.

* * * * *